(12) United States Patent
Deslauriers

(10) Patent No.: US 12,681,086 B2
(45) Date of Patent: Jul. 14, 2026

(54) TEMPERATURE INDEPENDENT METHOD AND SYSTEM FOR APPLYING TTFIELDS

(71) Applicant: Novocure GmbH, Root (CH)

(72) Inventor: Richard Deslauriers, Woodbury, CT (US)

(73) Assignee: Novocure GmbH, Baar (CH)

( * ) Notice: Subject to any disclaimer, the term of this patent is extended or adjusted under 35 U.S.C. 154(b) by 709 days.

(21) Appl. No.: 17/931,980

(22) Filed: Sep. 14, 2022

(65) Prior Publication Data

US 2023/0079302 A1    Mar. 16, 2023

Related U.S. Application Data

(60) Provisional application No. 63/244,004, filed on Sep. 14, 2021.

(51) Int. Cl.
    *G01R 31/36* (2020.01)
    *G01R 31/00* (2006.01)
    (Continued)

(52) U.S. Cl.
    CPC ........... *G01R 31/36* (2013.01); *G01R 31/006* (2013.01); *G01R 31/3842* (2019.01); *G01R 31/389* (2019.01)

(58) Field of Classification Search
    CPC .... G01R 31/36; G01R 31/006; G01R 31/389; G01R 31/3842
    See application file for complete search history.

(56) References Cited

U.S. PATENT DOCUMENTS 3,665,441 A * 5/1972 Suchomel .............. G08B 17/11
                                                        250/385.1
2015/0112321 A1* 4/2015 Cadouri ............. A61B 18/1206
                                                        606/34

(Continued)

FOREIGN PATENT DOCUMENTS

CA          2676407 A1 *  8/2008  ............. A61B 1/018
CN      109103178 A  * 12/2018  ............. H01L 23/60

(Continued)

OTHER PUBLICATIONS

Cornelia Wenger "A Review on Tumor-Treating Fields (TTFields): CLinical Implications Inferred From Computational Modeling", pp. 195-207; IEEE Reviewsin Biomedical Engineering vol. 11, 2018; XPO011687580, ISSN: 1937-3333, DOI: 10.1109/RBME.2017. 2765282; Jul. 25, 2018 (Year: 2018).*

(Continued)

*Primary Examiner* — Michael J Dalbo
*Assistant Examiner* — Kaleria Knox
(74) *Attorney, Agent, or Firm* — DUNLAP CODDING, P.C.

(57)          ABSTRACT

A system and method for delivering TTFields are herein described. The system comprises, a first port operable to receive a lead of a first pad, a second port operable to receive a lead of a second pad, an electric field generator having circuitry operable to generate an electric signal having a frequency, a current, and a voltage, the frequency in a range of about 50 kHz to about 1 MHz, the circuitry operable to supply the electric signal to the first port and the second port, and to control the current to maintain the current within plus or minus 5% of a current threshold during a period of time in which at least one of a measured voltage and a measured impedance is below a threshold, and a power supply operable to supply power to the electric field generator.

20 Claims, 3 Drawing Sheets

(51) Int. Cl.
G01R 31/3842 (2019.01)
G01R 31/389 (2019.01)

(56) References Cited

U.S. PATENT DOCUMENTS

| | | | | |
|---|---|---|---|---|
| 2016/0022349 A1* | 1/2016 | Woloszko | .............. | A61B 18/14 |
| | | | | 606/34 |
| 2016/0228698 A1* | 8/2016 | Horton | ................. | A61N 1/0432 |
| 2020/0269043 A1* | 8/2020 | Wasserman | ............ | A61B 18/14 |
| 2020/0330756 A1* | 10/2020 | Schmidt | ................... | A61N 1/06 |
| 2020/0330757 A1* | 10/2020 | Schmidt | ................... | A61N 1/40 |
| 2021/0196348 A1 | 7/2021 | Wasserman | | |
| 2021/0203250 A1* | 7/2021 | Wasserman | ........ | A61N 1/36002 |

FOREIGN PATENT DOCUMENTS

| | | | | |
|---|---|---|---|---|
| ES | 2203678 | * | 4/2004 | |
| ES | 2203678 T | * | 4/2004 | |
| GB | 2528712 A | * | 2/2016 | ............. A24F 15/00 |
| JP | 2008547195 A | * | 12/2000 | |
| KR | 102782701 B1 | * | 3/2025 | ........... A61B 5/7225 |
| WO | WO-2017189729 A1 | * | 11/2017 | .......... B23K 9/1006 |
| WO | WO-2021142549 A1 | * | 7/2021 | ............. A61B 5/055 |

OTHER PUBLICATIONS

European Patent Office acting as the International Search Authority; International Search Report and Written Opinion regarding PCT/IB2022/058636; dated Sep. 13, 2022.

Wenger, et al.; "A Review on Tumor-Treating Fields (TTFields): Clinical Implications Inferred From Computational Modeling," IEEE Reviews in Biomedical Engineering (2018), vol. 11, pp. 195-207.

Taiwan Intellectual Property Office, Office Action regarding Taiwan Patent Application No. 111134748, dated Nov. 27, 2025, with English Translation.

* cited by examiner

TEMPERATURE INDEPENDENT METHOD AND SYSTEM FOR APPLYING TTFIELDS

CROSS REFERENCE TO RELATED APPLICATIONS/INCORPORATION BY REFERENCE STATEMENT

This non-provisional application claims the benefit of U.S. Provisional Application No. 63/244,004, filed on Sep. 14, 2021. The entire contents of the above-referenced application are hereby expressly incorporated herein by reference in their entirety.

BACKGROUND

Tumor Treating Fields (TTFields or TTFs) are low intensity (e.g., 1-3 V/cm) alternating electric fields within the intermediate frequency range (50 kHz-1 MHz, such as, for example, 100 kHz) that target solid tumors by disrupting mitosis. This non-invasive treatment targets solid tumors and is described, for example, in U.S. Pat. Nos. 7,016,725; 7,089,054; 7,333,852; 7,565,205; 8,244,345; 8,715,203; 8,764,675; 10,188,851; and 10,441,776. TTFields are typically delivered through two pairs of transducer arrays that generate perpendicular fields within the treated tumor; the transducer arrays that make up each of these pairs are positioned on opposite sides of the body part that is being treated. More specifically, for the OPTUNE® system, one pair of electrodes of the transducer array is located to the left and right (LR) of the tumor, and the other pair of electrodes of the transducer array is located anterior and posterior (AP) to the tumor.

TTFields are approved for the treatment of glioblastoma multiforme (GBM), and may be delivered, for example, via the OPTUNE® system (Novocure Limited, St. Helier, Jersey), which includes transducer arrays placed on the patient's shaved head. More recently, TTFields therapy has been approved as a combination therapy with chemotherapy for malignant pleural mesothelioma (MPM), and may find use in treating tumors in other parts of the body.

Each transducer array used for the delivery of TTFields in the OPTUNE® device comprises a set of non-conductive ceramic disk electrodes, which are coupled to the patient's skin (such as, but not limited to, the patient's shaved head for treatment of GBM) through a layer of conductive medical gel. To form the ceramic disk electrodes, a conductive layer is formed on a top surface of nonconductive ceramic material. A bottom surface of the nonconductive ceramic material is coupled to the conductive medical gel. The nonconductive ceramic material is a safety feature to ensure that direct-current signals are blocked from unintentionally being transmitted to the patient by mistake.

The purpose of the medical gel is to deform to match the body's contours and to provide good electrical contact between the arrays and the skin; as such, the gel interface bridges the skin and reduces interference. The device is intended to be continuously worn by the patient for 2-4 days before removal for hygienic care and re-shaving (if necessary), followed by reapplication with a new set of arrays. As such, the medical gel remains in substantially continuous contact with an area of the patient's skin for a period of 2-4 days at a time, and there is only a brief period of time in which the area of skin is uncovered and exposed to the environment before more medical gel is applied thereto.

One approach to applying the TTField in different directions is to apply the field between a first set of electrodes for a period of time, then applying a field between a second set of electrodes for a period of time, then repeating that cycle for an extended duration (e.g., over a period of days or weeks).

In order to generate the TTFields, current is applied to each electrode of the transducer array. The application of current over a period of time causes each electrode to warm and some of the electrodes may eventually become hot, and thus may become uncomfortable or painful to the patient. The previous systems included temperature sensors integrated with the electrodes to determine the temperature of particular electrodes. When any one of the electrodes reached a temperature threshold, the current and/or the voltage supplied to all of the electrodes was reduced. In order to maintain the desired temperature of the transducer array, the current applied is generally lowered, resulting in a weaker TTField, and/or the transducer array is powered off, thus shortening the duration of treatment.

Because of this heating of the transducer array, new and improved array assemblies that reduce the temperature of the transducer array while generating a more powerful TTField are desired. It is to such assemblies and methods of producing and using the same, that the present disclosure is directed.

SUMMARY OF THE DISCLOSURE

The problem of reducing the temperature of the transducer array while generating a more powerful TTField is solved by a system for generating TTFields, comprising: a first port operable to receive a lead of a first pad; a second port operable to receive a lead of a second pad; an electric field generator having circuitry operable to generate an electric signal having a frequency, a current, and a voltage, the frequency in a range of about 50 kHz to about 1 MHz, the circuitry operable to supply the electric signal to the first port and the second port, and to control the current to maintain the current within plus or minus 5% of a current threshold during a period of time in which at least one of a measured voltage and a measured impedance is below a threshold; and a power supply operable to supply power to the electric field generator.

When the first and second pad are applied to skin of the patient, and the electric signal having a frequency, a current, and a voltage, the frequency in a range of about 50 kHz to about 1 MHz, is supplied to the first pad and the second pad, a tumor treating electric field is applied to the subject and current flows between the first pad and the second pad. In this instance, impedance between the first pad and the second pad is due to the electrical connection of the first pad and the second pad to the subject, and also due to the subject's body.

Conventionally, the electric field generator sends an electric signal at a maximum power and the first and second pads are intended to be continuously worn by the patient for 2-4 days before removal for hygienic care and re-shaving (if necessary), followed by reapplication with a new set of pads. In this time period, the subject's hair can grow and push the conventional electrode arrays away from the subject's skin and the subject's skin may produce oils thereby increasing impedance in the electrical connection between the conventional pads and the patient's skin. This increase in impedance can increase the temperature of the conventional pads. The conventional electric field generator, in communication with one or more temperature sensor in the conventional pads may reduce the current applied to the conventional pads which in turn causes a reduction in the tumor treating fields applied to the subject. This requires complex processing to constantly monitor the temperature of the conventional pads as well as additional wiring to communicate temperature signals from each temperature sensor to the conventional electric field generator.

However, when the electric field generator transmits the electric signal with a current at a predetermined threshold and monitors an impedance between the pads, the electric field generator can decrease the current when the measured impedance reaches a threshold; thereby maintaining an electric signal having a current and a voltage that are below a current threshold and voltage threshold which would cause the pads to become too heated and uncomfortable to the subject thereby permitting a consistent and powerful TTF field to be applied to the subject while maintaining the pads at a lower temperature.

The details of one or more implementations of the subject matter described in this specification are set forth in the accompanying drawings and the description below. Other aspects, features and advantages of the subject matter will become apparent from the description, the drawings, and the claims.

BRIEF DESCRIPTION OF THE DRAWINGS

The accompanying drawings, which are incorporated in and constitute a part of this specification, illustrate one or more implementations described herein and, together with the description, explain these implementations. The drawings are not intended to be drawn to scale, and certain features and certain views of the figures may be shown exaggerated, to scale or in schematic in the interest of clarity and conciseness. Not every component may be labeled in every drawing. Like reference numerals in the figures may represent and refer to the same or similar element or function. In the drawings.

DETAILED DESCRIPTION

Figures 1, 2, 3, 4:
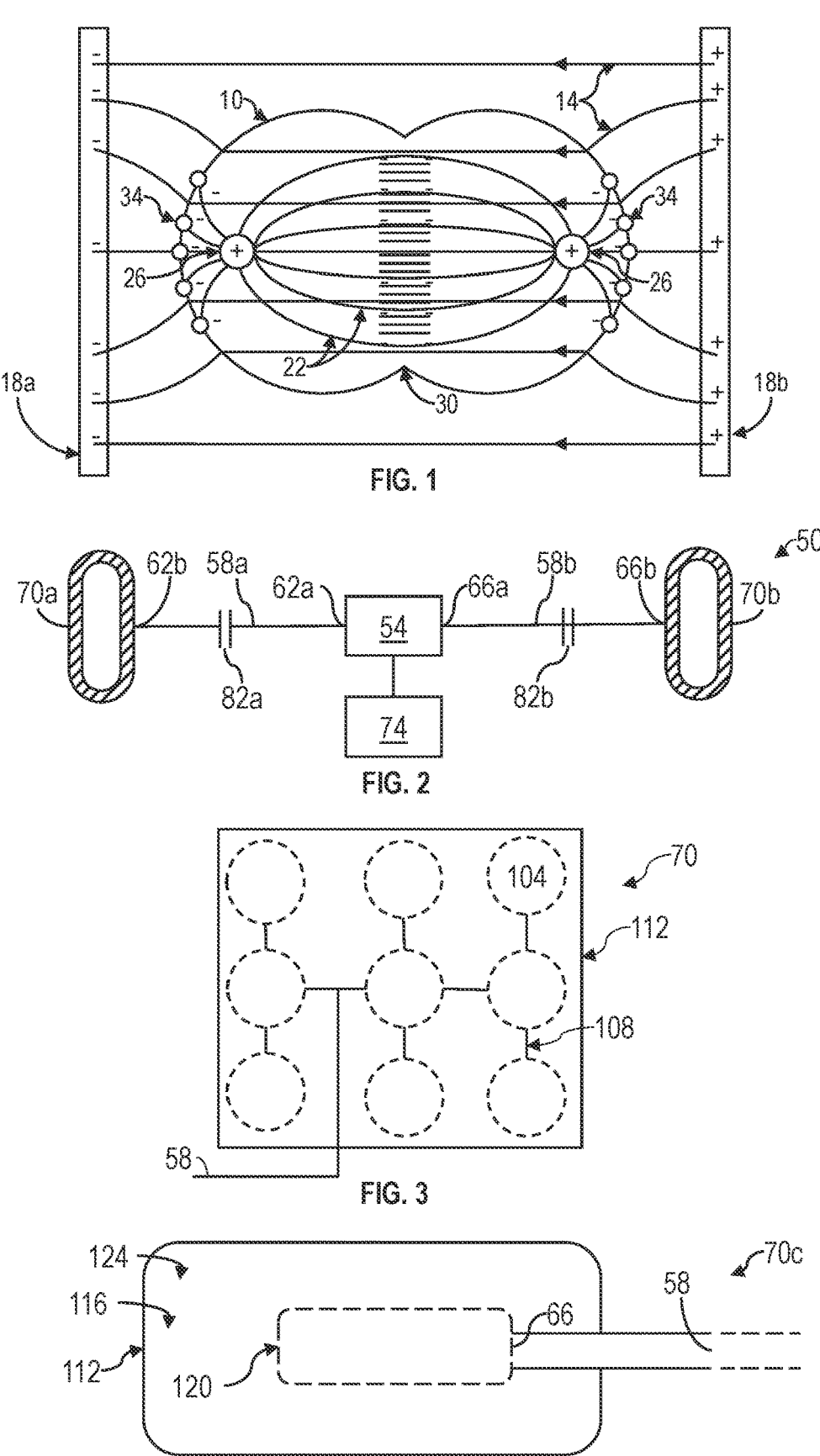
FIG. 1 is an exemplary embodiment of a schematic diagram of electrodes as applied to living tissue.
FIG. 2 is an exemplary embodiment of an electronic device configured to generate a TTField constructed in accordance with the present disclosure.
FIG. 3 is a block diagram of an exemplary embodiment of a pad constructed in accordance with the present disclosure.
FIG. 4 is a block diagram of another exemplary embodiment of a pad constructed in accordance with the present disclosure.

Before explaining at least one embodiment of the inventive concept(s) in detail by way of exemplary language and results, it is to be understood that the inventive concept(s) is not limited in its application to the details of construction and the arrangement of the components set forth in the following description. The inventive concept(s) is capable of other embodiments or of being practiced or carried out in various ways. As such, the language used herein is intended to be given the broadest possible scope and meaning; and the embodiments are meant to be exemplary—not exhaustive.

While the compositions, assemblies, systems, kits, and methods of the inventive concept(s) have been described in terms of particular embodiments, it will be apparent to those of skill in the art that variations may be applied to the compositions and/or methods and in the steps or in the sequence of steps of the methods described herein without departing from the concept and scope of the inventive concept(s). All such similar substitutions and modifications apparent to those skilled in the art are deemed to be within the scope and concept of the inventive concept(s) as defined by the appended claims. In particular, where a method claim does not specifically state in the claims or description that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of embodiments described in the specification.

As utilized in accordance with the present disclosure, the following terms, unless otherwise indicated, shall be understood to have the following meanings:

The use of the term "a" or "an" when used in conjunction with the term "comprising" in the claims and/or the specification may mean "one," but it is also consistent with the meaning of "one or more," "at least one," and "one or more than one." As such, the terms "a," "an," and "the" include plural referents unless the context clearly indicates otherwise. Thus, for example, reference to "a compound" may refer to one or more compounds, two or more compounds, three or more compounds, four or more compounds, or greater numbers of compounds. The term "plurality" refers to "two or more."

The use of the term "at least one" will be understood to include one as well as any quantity more than one. In addition, use of the term "at least one of X, Y, and Z" is understood to include X alone, Y alone, and Z alone, and any combination of X, Y, and Z.

The use of ordinal number terminology (e.g., "first," "second," "third," "fourth," etc.) is solely for the purpose of differentiating between two or more items and is not meant to imply any sequence or order or importance to one item over another or any order of addition, for example.

The use of the term "or" in the claims is used to mean an inclusive "and/or" unless explicitly indicated to refer to alternatives only or unless the alternatives are mutually exclusive. For example, a condition "A or B" is satisfied by any of the following: A is true (or present) and B is false (or not present), A is false (or not present) and B is true (or present), and both A and B are true (or present).

As used herein, any reference to "one embodiment," "an embodiment," "some embodiments," "one example," "for example," or "an example" means that a particular element, feature, structure, or characteristic described in connection with the embodiment is included in at least one embodiment. The appearance of the phrase "in some embodiments" or "one example" in various places in the specification is not necessarily all referring to the same embodiment, for example. Further, all references to one or more embodiments or examples are to be construed as non-limiting to the claims.

Throughout this application, the term "about" is used to indicate that a value includes the inherent variation of error for a composition/apparatus/device, the method being employed to determine the value, or the variation that exists among the study subjects. For example, but not by way of limitation, when the term "about" is utilized, the designated value may vary from the specified value, as such variations are appropriate to perform the disclosed methods and as understood by persons having ordinary skill in the art.

As used in this specification and claim(s), the words "comprising" (and any form of comprising, such as "comprise" and "comprises"), "having" (and any form of having, such as "have" and "has"), "including" (and any form of including, such as "includes" and "include"), or "containing" (and any form of containing, such as "contains" and "contain") are inclusive or open-ended and do not exclude additional, unrecited elements or method steps.

The term "patient" as used herein includes human and veterinary subjects. "Mammal" for purposes of treatment refers to any animal classified as a mammal, including (but not limited to) humans, domestic and farm animals, nonhuman primates, and any other animal that has mammary tissue.

Circuitry, as used herein, may be analog and/or digital components, or one or more suitably programmed processors (e.g., microprocessors) and associated hardware and software, or hardwired logic. Also, "components" may perform one or more functions. The term "component," may include hardware, such as a processor (e.g., microprocessor), an application specific integrated circuit (ASIC), a field programmable gate array (FPGA), a combination of hardware and software, and/or the like. The term "processor" as used herein means a single processor or multiple processors working independently or together to collectively perform a task.

As used herein, the term TTField (TTFields, or TTF(s)) refers to low intensity (e.g., 1-4 V/cm) alternating electric fields of medium frequencies (about 50 kHz-1 MHz, and more preferably from about 50 kHz-1 Mhz) that when applied to a conductive medium, such as a human body, via electrodes may be used, for example, to treat tumors as described in U.S. Pat. Nos. 7,016,725, 7,089,054, 7,333,852, 7,565,205, 7,805,201, and 8,244,345 by Palti (each of which is incorporated herein by reference) and in a publication by Kirson (see Eilon D. Kirson, et al., Disruption of Cancer Cell Replication by Alternating Electric Fields, Cancer Res. 2004 64:3288-3295). TTFields have been shown to have the capability to specifically affect cancer cells and serve, among other uses, for treating cancer.

As used herein, the term "pad" refers to one or more conductive materials that is/are configured to be placed over a part of a body of a subject to generate a TTField upon receiving TTSignals from an electric field generator.

Turning now to the inventive concept(s), certain non-limiting embodiments thereof include a system and method of implementing a system comprising, a first port operable to receive a lead of a first pad, a second port operable to receive a lead of a second pad, an electric field generator having circuitry operable to generate an electric signal having a frequency, a current, and a voltage, the frequency in a range of about 50 kHz to about 1 MHz (and more preferably in a range from 50 kHz to 500 kHz), the circuitry operable to supply the electric signal to the first port and the second port, and to control the current to maintain the current within plus or minus 5% of a current threshold during a period of time in which at least one of a measured voltage and a measured impedance is below a threshold, and a power supply operable to supply power to the electric field generator.

Referring now to the drawings and in particular to FIG. 1, shown therein is a diagram of an exemplary embodiment of a dividing cell 10, under the influence of external TTFields generally indicated as lines 14, generated by a first electrode 18a having a negative charge and a second electrode 18b having a positive charge. Further shown are microtubules 22 that are known to have a very strong dipole moment. This strong polarization makes the microtubules 22, as well as other polar macromolecules and especially those that have a specific orientation within the cell 10 or its surroundings, susceptible to electric fields. The microtubules' 22 positive charges are located at two centrioles 26 while two sets of negative poles are at a center 30 of the dividing cell 10 and point of attachment 34 of the microtubules 22 to the cell membrane. The locations of the charges form sets of double dipoles and therefore are susceptible to electric fields of differing directions. In one embodiment, the cells go through electroporation, that is, DNA or chromosomes are introduced into the cells using a pulse of electricity to briefly open pores in the cell membranes.

Turning now to FIG. 2, the TTFields described above that have been found to advantageously destroy tumor cells may be generated by an electronic apparatus 50. FIG. 2 is a simple schematic diagram of the electronic apparatus 50 illustrating major components thereof. The electronic apparatus 50 includes an electric field generator 54 and a pair of conductive leads 58, including first conductive lead 58a and second conductive lead 58b. The first conductive lead 58a includes a first end 62a and a second end 62b. The second conductive lead 58b includes a first end 66a and a second end 66b. The first end 62a of the first conductive lead 58a is conductively attached to the electric field generator 54 and the first end 66a of the second conductive lead 58b is conductively attached to the electric field generator 54.

The electric field generator 54 generates desirable electric signals (TTSignals) in the shape of waveforms or trains of pulses as an output. The second end 62b of the first conductive lead 58a is connected to a pad 70a and the second end 66b of the second conductive lead 58b is connected to a pad 70b, that is supplied with the electric signals (e.g., wave forms). The electric signals generate an electric field (i.e., TTField), having a frequency and an amplitude, to be generated between the pad 70a and the pad 70b.

Each of the pad 70a and the pad 70b include one or more conductive electrode element that may be capacitively coupled with a field target by a non-conductive layer. Alternative constructions for the pad 70a and the pad 70b may also be used, including, for example, transducer arrays using a non-conductive layer formed of a ceramic element that is disc shaped, or is not disc-shaped, and/or non-conductive layer(s) that use non-ceramic dielectric materials positioned over a plurality of flat conductors. Examples of the latter include polymer films disposed over electrical contacts on a printed circuit board or over flat pieces of metal.

In some embodiments, the pad 70a and the pad 70b may also include electrode elements that are not capacitively coupled with the field target. In this situation, each of the pad 70a and the pad 70b may be implemented using a region of a conductive material that is configured for placement against a person's body, with no insulating dielectric layer disposed between the conductive elements and the body. Examples of the conductive material include, but are not limited to, a conductive film, a conductive fabric, and/or a conductive foam. Other alternative constructions for implementing the pad 70a and the pad 70b may also be used, as long as they are capable of delivering TTFields to the field target. Optionally, a skin-contact layer may be disposed between the pad 70a and the field target; and the pad 70b and the field target in any of the embodiments described herein. The skin-contact layer helps to adhere/affix the pad 70a and the pad 70b to the field target, provides a conductive pathway for the electric fields to pass between the pads 70a and 70b and the field target through an intervening non-conductive or conductive layer, and is biocompatible. Examples of skin-contact layers include hydrogel as well as carbon conductive adhesive composites. The latter adhesives may comprise conductive particles, such as, for example, carbon black powder or carbon fibers, etc.

While the electronic apparatus 50 shown in FIG. 2 comprises only two pads 70 (the pad 70a and the pad 70b), in some embodiments, the electronic apparatus 50 may comprise more than two pads 70.

The electric field generator 54 generates an alternating voltage wave form at frequencies in the range from about 50 kHz to about 1 MHz (preferably from about 50 kHz to about 500 kHz, or from about 100 kHz to about 300 kHz) (i.e., the TTFields). The required voltages are such that an electric field intensity in tissue within the treatment area is in the range of about 0.1 V/cm to about 10 V/cm. To achieve this field, the potential difference between the two conductors 18 in each of the pad 70a and the pad 70b is determined by the relative impedances of the system components, e.g., a fraction of the electric field on each component is given by that component's impedance divided by a total circuit impedance.

In certain particular (but non-limiting) embodiments, the pad 70a and the pad 70b generate an alternating electric current and field within a target region of a patient. The target region typically comprises at least one tumor, and the generation of the alternating electric field selectively destroys or inhibits growth of the tumor. The alternating electric field may be generated at any frequency that selectively destroys or inhibits growth of the tumor, i.e., a TTField.

In certain particular (but non-limiting) embodiments, the alternating electric current and field may be imposed at two or more different frequencies. When two or more frequencies are present, each frequency is selected from any value within the range of frequencies of a TTField.

In order to optimize the electric field (i.e., TTField) distribution, the pad 70a and the pad 70b (pair of pads) may be configured or oriented differently depending upon the application in which the pair of pads 70a and 70b are to be used. The pair of pads 70a and 70b, as described herein, are externally applied to a patient (e.g., the field target), that is, are generally applied to the patient's skin, in order to apply the electric current, and electric field (TTField), thereby generating current within the patient's tissue. Generally, the pair of pads 70a and 70b are placed on the patient's skin by a user (or a helper) such that the electric field is generated across patient tissue within a treatment area. TTFields that are applied externally can be of a local type or widely distributed type, for example, the treatment of skin tumors and treatment of lesions close to the skin surface, or a tumor further in the body.

In one embodiment, the user may be a medical professional, such as a doctor, nurse, therapist, or other person acting under the instruction of a doctor, nurse, or therapist. In another embodiment, the user may be the patient or other person acting under the instruction of the patient, that is, the patient may place the pad 70a and the pad 70b on their treatment area.

Optionally and according to another exemplary embodiment, the electronic apparatus 50 includes a control box 74. When the control box 74 is included, the control box 74 controls the output of the electric field generator 54 causing the output to remain constant at a value preset by the user. Alternatively, the control box 74 sets the output at the maximal value that does not cause excessive heating of the treatment area. In either of the above cases, the control box 74 may issue a warning, or the like, when an impedance, current, or voltage exceeds a threshold (as described below in more detail).

The conductive leads 58 are standard isolated conductors with a flexible metal shield, preferably grounded thereby preventing spread of any electric field generated by the conductive leads 58. The pad 70a and the pad 70b may have specific shapes and positioning so as to generate the TTField of a desired configuration, direction, and intensity at the treatment area and only at the treatment area so as to focus the treatment. The specifications of the electronic apparatus 50 as a whole and its individual components are largely influenced by the fact that at the frequency of the TTFields, living systems behave according to their "Ohmic", rather than their dielectric properties. In one embodiment, the conductive leads 58 do not include an isolated conductor connected to a temperature sensor used for temperature measurement, thus reducing a number of wires within each conductive lead 58 and reducing a weight of the pads 70 and the conductive leads 58 thereby improving patient comfort.

In one embodiment, to protect the patient from any current due to DC voltage or DC offset voltage passing through the patient, leads 58a and 58b may include a DC blocking component, such as blocking capacitor 82a and blocking capacitor 82b, to block DC current from passing to the pad 70a and the pad 70b. Exemplary configurations and construction of the DC blocking component are described in more detail in U.S. Patent Publication 2021/0346693 A1 filed on May 6, 2021 entitled "CONDUCTIVE PAD GENERATING TUMOR TREATING FIELD AND METHODS OF PRODUCTION AND USE THEREOF", the entire contents of which are hereby incorporated herein in their entirety.

Referring now to FIG. 3, shown therein is a diagram of an exemplary embodiment of the pad 70 constructed in accordance with the present disclosure. The pad 70 includes one or more electrode element 104. As shown in FIG. 3, each pad 70 is configured as a set of one or more electrode elements 104. Pads 70 may utilize electrode elements 104 that are capacitively coupled. In the example shown in FIG. 3, the pad 70 is configured as multiple electrode elements 104 (for example, about 2 cm in diameter) that are interconnected via flex wires 108. Each electrode element 104 may include a ceramic disk and an electrode layer. In one embodiment, the pad 70 includes an outer peripheral edge 112.

Alternative constructions for the pad 70 may be used, including, for example ceramic elements that are disc-shaped, ceramic elements that are not disc-shaped, and non-ceramic dielectric materials positioned between the electrode layer and a skin-facing surface of the pads 70 over a plurality of flat conductors. Examples of non-ceramic dielectric materials positioned over a plurality of flat conductors include: polymer films disposed over pads on a printed circuit board or over flat pieces of metal.

In one embodiment, pads 70 that utilize electrode elements 104 that are not capacitively coupled may also be used. In this situation, each electrode element 104 of the transducer array would be implemented using a region of a conductive material that is configured for placement against a person's body, with no insulating dielectric layer disposed between the electrode elements 104 and the body. Examples of the conductive material include a conductive film, a conductive fabric, and a conductive foam. Other alternative constructions for implementing the pads 70 may also be used, as long as they are capable of delivering TTFields to the person's body. Optionally, a gel layer may be disposed between the pad 70 and the person's body in any of the embodiments described herein.

In one embodiment, the pad 70 may be constructed in accordance with any pad disclosed in U.S. application Ser. No. 17/813,837 filed Jul. 20, 2022 entitled "CONDUCTIVE PAD GENERATING TUMOR TREATING FIELD AND METHODS OF PRODUCTION AND USE THEREOF", the entire contents of which are hereby incorporated herein in their entirety.

In some embodiments, the electric field generator 54 uses a control process for controlling the voltage and/or current supplied to the pad 70 without obtaining or requiring feedback regarding the temperature of the pad 70. In these embodiments, the pad 70 may be devoid of a temperature sensor. Additionally, in these embodiments, the leads 58a and/or 58b contain wiring related to powering the electrode elements 104 but are devoid of wires used for temperature measurement. This has the added benefit of reducing the total number of wires extending from the electric field generator 54 to the patient—which improves patient comfort and reduces the level of circuitry as compared to prior art methods which require temperature measurement(s) to prevent the pads from overheating.

Referring now to FIG. 4, shown therein is a top plan view of an exemplary embodiment of a pad 70c. The pad 70c is an exemplary embodiment of the pad 70a or the pad 70b. The pad 70c may be provided with a top 124, a bottom 128, an outer peripheral edge 112, and an electrode element 120 bounded by the outer peripheral edge 112. As shown, the pad 70c is connected to the second end 66 of the conductive lead 58. The pad 70c is constructed so as to have sufficient flexibility and to be able to conform to a portion of the patient, such as a portion of the patient's head, the patient's knee, the patient's elbow, or the like. The pad 70c may also be constructed such that the electrode element 120 is continuous, and extends to the outer peripheral edge 112. In the example shown, the pad 70c is provided with a rectangular shape, or substantially rectangular shape having rounded vertices. However, it should be understood that the pad 70c can be provided with any type of shape such as a polygon, circle, or fanciful shape. Further, the pad 70c may be constructed such as to be cut and/or shaped at a point of use so as to be custom fitted for a particular part of a particular patient.

In one embodiment, the pad 70c is provided with a durable topcoat layer 116 as the top 124. The durable topcoat layer 116 may be a non-woven, non-conductive fabric. The durable topcoat layer 116 provides a safe handling surface for the pad 70c to electrically isolate the electrode element 120 from the top 124 of the pad 70c. In some embodiments, the durable topcoat layer 116 is colored to match or approximate the skin color of the patient.

In one embodiment, the pad 70c is constructed in accordance with one or more embodiment of any pad described in U.S. Patent Publication 2021/0346693 A1 filed on May 6, 2021 entitled "CONDUCTIVE PAD GENERATING TUMOR TREATING FIELD AND METHODS OF PRO- DUCTION AND USE THEREOF", the entire contents of which are hereby incorporated herein in their entirety.

Figure 5:
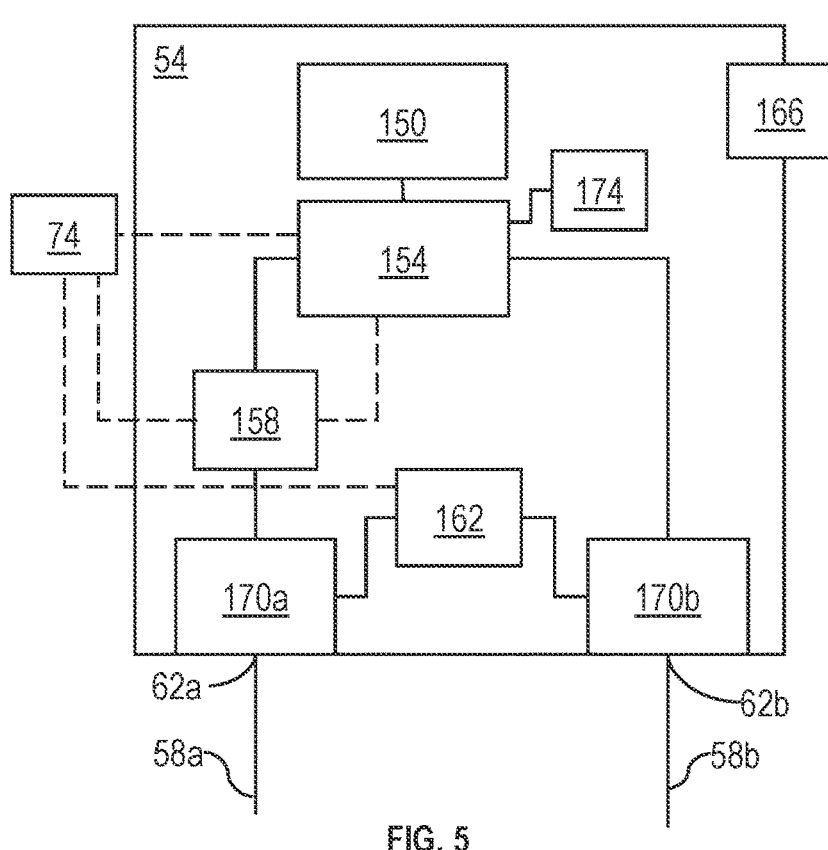
FIG. 5 is a functional block diagram of an exemplary embodiment of the electric field generator of FIG. 2 constructed in accordance with the present disclosure.

Referring now to FIG. 5, shown therein is a functional block diagram of an exemplary embodiment of the electric field generator 54 constructed in accordance with the present disclosure. The electric field generator 54 generally comprises circuitry, including a frequency generator 150, an amplifier 154, an ammeter 158, a voltmeter 162, and a power supply 166. Outputs from the ammeter 158 and the voltmeter 182 are supplied to a controller within the control box 74 depicted in FIG. 4. The controller within the control box 74 has an output supplied to the amplifier 154 so that the control box 74 can control the amplifier 154 based on readings from the ammeter 158 and/or the voltmeter 162 to implement a control process disclosed herein. The electric field generator 54 further comprises at least two ports 170, shown in FIG. 5 as port 170a operable to couple to the first end 62a of the conductive lead 58a and port 170b operable to couple to the first end 62b of the conductive lead 58b.

In one embodiment, one or more component of the electric field generator 54 may be combined with one or more other component. For example, the amplifier 154 may be combined with the frequency generator 150, such that the amplifier 154 and the frequency generator 150 are embedded within the same circuitry, e.g., on the same circuit board (PCB) or same integrated circuit (IC), for example.

In one embodiment, the frequency generator 150 is circuitry and is operable to generate a frequency of the TTField, e.g., generate an electric signal having a frequency of between about 50 kHz and 1 MHz, and more preferably a frequency of between about 50 kHz and 500 kHz.

In one embodiment, the frequency generator 150 is operable to generate the electric signal having one or more of a sine waveform, a square waveform, a pulse waveform, a sawtooth waveform, a modified sine waveform and/or a triangle waveform. In one embodiment, the frequency generator 150 is further operable to generate the electric signal having a step waveform or any fanciful or arbitrary waveform.

In one embodiment, the amplifier 154 is circuitry and amplifies the electric signal to have a desired amperage, voltage, and/or power. For example, the amplifier 154 may amplify the electric signal to have an amperage of about 2 amps (A). In one embodiment, the amplifier 154 is adjustable, that is, the amplifier 154 may amplify the electric signal to have an amperage of between 0.5 A and about 2 A. In some embodiments, the amplifier 154 may amplify the electric signal to have an amperage of between about 0.5 A and 6 A.

In one embodiment, the amplifier 154 also amplifies the electric signal to have a desired voltage. For example, the amplifier may amplify the electric signal to have a voltage of about 240 volts (V). In other embodiments, the amplifier 154 amplifies the electric signal to have a voltage of between about 20 V to about 240 V. In one embodiment, the amplifier 154 is an AC to AC amplifier. An example of an AC to AC amplifier is a voltage and current gain power boost amplifier such as the PB50 sold by Apex Microtechnology Inc. (Tucson, AZ, USA).

In one embodiment, the amplifier 154 includes at least one threshold. The at least one threshold may be selected from one or more of a voltage threshold, a current threshold, and a power threshold. Each threshold may also define a range between an upper threshold and a lower threshold. For example, the amplifier 154 may include a voltage threshold within a range of about 20 V to about 240 V, that is, the voltage threshold may have an upper voltage threshold of 240 V and a lower voltage threshold of about 20 V. Similarly, the amplifier 154 may include an amperage threshold of about 1.5 A to about 5 A, that is, the amperage threshold may have an upper amperage threshold of about 5 A and a lower amperage threshold of about 1.5 A.

In one embodiment, each threshold, e.g., the voltage threshold, the current threshold, and the power threshold, may be predetermined, that is, each threshold is determined before the electric field generator 54 is used. In one embodiment, the power threshold is predetermined and one or more of the voltage threshold and the current threshold are calculated based on the power threshold such that, for example, an electric signal having a current at the current threshold and a voltage at the voltage threshold would not exceed the power threshold.

In one embodiment, the electric field generator 54 may be constructed to provide an electric signal for a particular portion of a patient's body. For example, the electric field generator 54 may be configured to be a cranial electric field generator in which the amplifier 154 includes a cranial current threshold with a range from about 1.5 A to about 3 A. Similarly, the electric field generator 54 may be configured to be a torsal electric field generator 54 in which the amplifier 154 includes a torsal current threshold within a range from about 1.5 A to about 5 A. Furthermore, the configurations for the cranial electric field generator 54 and the torsal electric field generator 54 may differ in other thresholds, such as the voltage threshold and/or the power threshold, as so required to provide a therapeutic benefit. In this manner, the electric field generator 54 may be constructed such that it generates the TTField having a therapeutic benefit to a particular portion of the patient's body.

In one embodiment, the electric field generator 54 further includes a selector 174 operable to select one or more predetermined threshold to apply to the amplifier 154. For example, the selector 174 may indicate a first selection whereby the cranial current threshold is applied to the amplifier 154 or may indicate a second selection whereby the torsal current threshold is applied to the amplifier 154. While only two threshold examples are provided, it is understood that any number of predetermined thresholds, for example, voltage thresholds, current thresholds, an impedance threshold (described below), and/or power thresholds, may be applied to the amplifier 154 as indicated by the selector 174.

In one embodiment, the amplifier 154 is electrically coupled to the port 170a and the port 170b thereby supplying the electric signal operable to generate the TTField to the port 170a through the conductive lead 58a to the pad 70a and/or the port 170b through the conductive lead 58b and to the pad 70b. The pad 70a and the pad 70b (shown in FIG. 2), receiving the electric signal, generate the TTField.

In one embodiment, the electric field generator 54 includes the ammeter 158 electrically disposed between the amplifier 154 and one or more of the ports 170. As shown in FIG. 5, for example, the ammeter 158 is electrically disposed between the amplifier 154 and the port 170a. The ammeter 158, being therein disposed, is operable to determine a measured amperage of the electric signal.

In one embodiment, the ammeter 158 may be in communication with the amplifier 154, and/or the control box 74, and operable to cause the amplifier 154 to adjust the amperage applied to the electric signal such that the measured amperage is kept within the current threshold.

In one embodiment, the electric field generator 54 includes the voltmeter 162 electrically coupled to two ports 170 and is operable to determine a measured voltage between the two ports 170. As shown in FIG. 5, for example, the voltmeter 162 is electrically coupled to the port 170a and the port 170b and is operable to determine a measured voltage between the port 170a and the port 170b.

In one embodiment, the voltmeter 162 is in communication with the amplifier 154, and/or the control box 74, and is operable to cause the amplifier 154 to adjust a voltage applied to the electric signal such that the measured voltage is kept within the voltage threshold.

In one embodiment, the electric field generator 54 includes at least two ports 170, such as the port 170a and the port 170b. In other embodiments, the electric field generator 54 may include more than two ports 170. Each port 170 is operable to receive the first end 62 of the conductive lead 58 and conduct the electric signal received from the amplifier 154 to the conductive lead 58 and, thus, to the pad 70. As shown in FIG. 5, the port 170a is operable to receive the first end 62a of the conductive lead 58a and conduct the electric signal received from the amplifier 154 to the conductive lead 58a and, thus, to the pad 70a (shown in FIG. 2), and the port 170b is operable to receiver the first end 62b of the conductive lead 58b and conduct the electric signal from the amplifier 154 to the conductive lead 58b and, thus, to the pad 70b (shown in FIG. 2).

In one embodiment, the electric field generator 54 includes the power supply 166. The power supply 166 supplies power to each component of the electric field generator 54. The power supply 166 may supply power to the amplifier 154, thereby providing operation of the amplifier 154 to increase the amperage and/or the voltage of the electric signal from the frequency generator 150.

In one embodiment, the power supply 166 is operable to be connected to a DC power source, such as a battery, for example, and may operate as a DC-DC converter, converting a voltage of the battery to a voltage needed to supply power to each component of the electric field generator 54.

In one embodiment, the power supply 166 is operable to be connected to an AC power source, such as an electrical outlet, and may operate as an AC-DC converter, converting a voltage and current of the AC power source to a DC voltage needed to supply power to each component of the electric field generator 54.

In one embodiment, the power supply 166 is operable to be connected to one or more of the DC power source and the AC power source. For example, the power supply 166 may be connected to both the DC power source and the AC power source at the same time. In this embodiment, for example, the power supply 166 of the electric field generator 54 may, while connected to the AC power source, charge the DC power source, and when disconnected from the AC power source, may supply power to each component of the electric field generator 54 from the DC power source. The construction and use of power supplies operable to convert DC power to DC power, to convert AC power to DC power, and/or operable to convert AC power to DC power and charge a battery are well known in the art. Thus, no further comments with respect to how to make and use the power supply 166 is deemed necessary.

Figure 6:
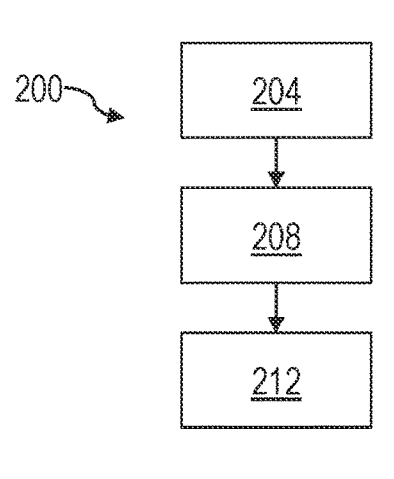
FIG. 6 is a process flow diagram of an exemplary embodiment of a process of using the electronic apparatus to apply a TTField to a patient.

Referring now to FIG. 6, shown therein is an exemplary embodiment of a process 200 of using the electronic apparatus 50 to apply a TTField to a patient. The process 200 generally comprises the steps of: applying at least two pads to the patient's skin (step 204); connecting each pad to an electric field generator (step 208); and generating an alternating electric field (TTField) having a frequency in a range of from about 50 kHz to about 1 MHz for a period of time (step 212).

In one embodiment, the step of applying two pads to the patient's skin (step 204) includes selecting two or more of the pad 70, the pad 70a, the pad 70b, the pad 70c, and/or the like, and applying the selected pads to the patient's skin.

The step of applying at least two pads to the patient's skin (step 204) may be performed by the user. In one embodiment, before applying the selected pads to the patient's skin, the patient's skin may need to be cleaned (e.g., such as but not limited to, cleansing of the skin of foreign matter or biological matter and shaving of the skin, if necessary).

In one embodiment, the step of connecting each pad to an electric field generator (step 208) may be performed by the user, such as at the time of use. In other embodiments, the step of connecting each pad to an electric field generator (step 208) may be performed at the time of manufacture.

In one embodiment, the step of connecting each pad to an electric field generator (step 208) may be performed before, after, or concurrently with the step of applying two pads to the patient's skin (step 204).

The step of generating an alternating electric field (TT-Field) (step 212) may be performed by the electric field generator 54 and may be instantiated by an operation performed by the user or the control box 74. For example, the frequency generator 150 of the electric field generator 54 may generate the electric signal having a frequency of between about 50 kHz and 1 MHz, and preferably a frequency of between about 50 kHz and 500 kHz, the amplifier 154 may apply a current or a voltage to the electric signal, and the pads 70, receiving the electric signal, may cause the electric signal to generate the alternating electric field (TT-Field).

In one embodiment, step 212 may be performed more than one time and the period of time for which the step 212 is performed a first time may be the same as or different from the period of time for which the step 212 is performed a second time (or other period(s) of time beyond the second time).

In some embodiments, step 212 is only performed once before the process 200 is repeated. There may be a time period between each time the process 200 is repeated. Each time the process 200 is repeated, the time period may be the same as or different from the previous time period. Each time the process 200 is repeated, the selected pads may be placed in the same or a different position on the patient's skin.

Figure 7:
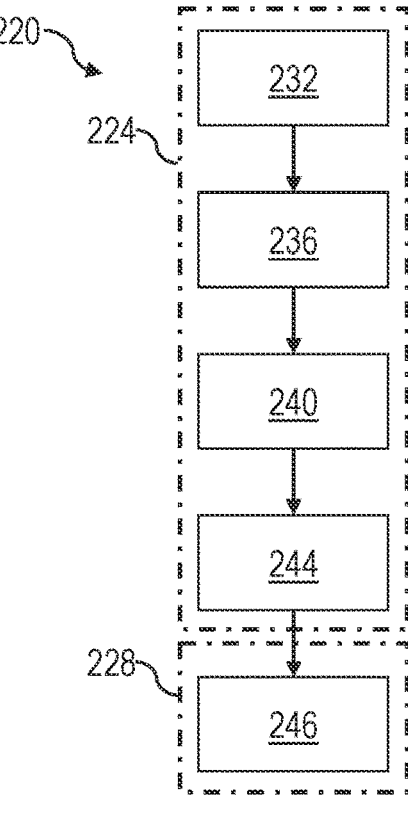
FIG. 7 is a process flow diagram of an exemplary embodiment of a control process conducted in accordance with the present disclosure.

Referring now to FIG. 7, shown therein is a process flow diagram of an exemplary embodiment of a control process 220 conducted in accordance with the present disclosure. The control process 220 can be divided into an initiation phase 224 and a maintenance phase 228. During the initiation phase 224, a current threshold is determined for current passing through the first pad 70a and the second pad 70b (step 232) and the electric signal is supplied (step 236). As the electric signal is being supplied to the first pad 70a and the second pad 70b, an electric field will be created within the patient's body causing the temperature of the first pad 70a and the second pad 70b to increase. The initiation phase 224 further includes: monitoring an impedance (step 240) and controlling a current of the electric signal (step 244). During the maintenance phase 228, the control process 220 includes: maintaining a voltage of the electric signal and reducing the current of the electric signal (step 246). As discussed for the control process 220, any reference to the pad 70 may be any pad 70 described above, such as pad 70, pad 70a, pad 70b, and/or pad 70c.

In one embodiment, determining a current threshold 248 for a first pad (step 232) includes determining a current threshold 248 (shown in FIG. 8A) for a first pad based on an expected impedance of the user on which the pad 70 is applied. The first pad may be any pad 70 described above, such as pad 70, pad 70a, pad 70b, and/or pad 70c.

In one embodiment, determining a current threshold 248 for a first pad (step 232) includes determining a duration for the electric signal and determining a current threshold 248 for a first pad based on an impedance of the patient's body for the duration. The first pad may be any pad 70 described above, such as pad 70, pad 70a, pad 70b, and/or pad 70c.

In one embodiment, determining a current threshold 248 for a first pad (step 232) includes determining the current threshold 248 based on a location on the user's body on which the first pad will be placed. For example, if the first pad will be placed in the torsal region, the current threshold 248 may be between about 1.5 A and about 5 A; however, if the first pad will be placed in the cranial region, the current threshold 248 may be between about 1.5 A and about 3 A. If the first pad will be placed in another region of the user's body, the current threshold 248 may be greater than or lesser than the current thresholds 248 discussed above.

In one embodiment, determining a current threshold 248 for a first pad (step 232) includes determining a current threshold 248 based on a therapeutic benefit required to treat the patient.

In one embodiment, determining a current threshold 248 for a first pad (step 232) may include, before use of the first pad on the patient, determining a maximum current that, when applied to the first pad, will prevent the first pad from exceeding a temperature threshold. The temperature threshold may be a temperature above which the first pad would be considered uncomfortable to contact. In one embodiment, the temperature threshold is between about 39 centigrade and 42 centigrade.

In one embodiment, determining a current threshold 248 for a first pad (step 232) may further include determining a current threshold 248 for a second pad. Determining a current threshold 248 for the second pad may be performed similarly to determining a current threshold 248 for a first pad (step 232) as described above. In some embodiments, determining the current threshold 248 for the second pad is not required, such as when the second pad is constructed similar to the first pad.

In one embodiment, supplying an electric signal (step 236) includes supplying an electric signal having a frequency in a range of about 50 kHz to about 500 kHz to two or more ports 170, e.g., the port 170a and the port 170b, of the electric field generator 54.

In one embodiment, supplying an electric signal (step 236) includes supplying an electric signal having a frequency in a range of about 50 kHz to about 1 MHz to two or more ports 170, e.g., the port 170a and the port 170b, of the electric field generator 54.

In one embodiment, supplying an electric signal (step 236) includes supplying the electric signal having a frequency in the range of about 50 kHz to about 500 kHz to any number of ports 170 of the electric field generator 54 in electrical communication with a pad 70, as desired.

In one embodiment, supplying an electric signal (step 236) includes supplying the electric signal with a current at, about, or below the current threshold 248. In one embodiment, supplying an electric signal (step 236) includes supplying the electric signal with the current within plus or minus 5% of the current threshold 248.

In one embodiment, supplying an electric signal (step 236) includes supplying the electric signal with a voltage at, about, or below a voltage threshold 252 (shown in FIG. 8B).

In one embodiment, supplying an electric signal (step 236) includes supplying the electric signal with the voltage within plus or minus 5% of the voltage threshold 252. In one embodiment, supplying an electric signal (step 236) includes supplying the electric signal with a voltage in the range of about 20 V to about 240 V. In one embodiment, supplying an electric signal (step 236) includes supplying the electric signal with a voltage based on the determined current threshold 248 and an impedance of the pads 70 applied to the patient, for example only, by calculating the product of the current threshold 248 and the impedance. In one embodiment, the impedance of the patient's body attached to the pads 70 is inversely proportional to a surface area of the pad 70.

In one embodiment, supplying an electric signal (step 236) includes supplying the electric signal with a voltage within a range of 95% to 100% of the voltage threshold 252. In one embodiment, supplying an electric signal (step 236) includes supplying the electric signal with a voltage within a range of within 5% of the voltage threshold 252.

Over time and due to a variety of factors and conditions at the skin-pad interface, the impedance between the ports 170 may change. For example, impedance between the ports 170 may change due to the patient's body warming, the patient's hair growing and pushing the pad 70 away from the skin, the patient's skin may make oil between the skin and the pad 70, the gel on the pad 70 may become less effective in transferring the electric field into the patient's body, such as from drying out or becoming contaminated, movement may loosen the pad 70 from the skin, etc. Therefore, the impedance between the first pad 70a and the second pad 70b may change overtime, and generally increase such that during the initiation phase 224, the impedance between the first pad 70a and the second pad 70b is lesser than the impedance between the first pad 70a and the second pad 70b during the maintenance phase 228.

In one embodiment, monitoring an impedance (step 240) includes monitoring the impedance between two or more ports 170, e.g., the port 170a and the port 170b, of the electric field generator 54. Monitoring the impedance may include determining, by the voltmeter 162, the applied voltage between the ports 170, and calculating the impedance between the ports 170 based on the applied voltage. For example only, if the amplifier 154 applies a power to the electric signal, the impedance may be calculated by dividing the square of the applied voltage by the applied power.

In one embodiment, monitoring an impedance (step 240) includes monitoring the impedance between two or more ports 170, e.g., the port 170a and the port 170b, of the electric field generator 54. Monitoring the impedance may include determining, by the ammeter 158, the applied amperage to a port 170, e.g., the port 170a in FIG. 5, and calculating the impedance between the ports 170 based on the applied amperage. For example, if the amplifier 154 applies a power to the electric signal, the impedance may be calculated by dividing the applied power by the square of the applied current.

In one embodiment, monitoring an impedance (step 240) includes monitoring the impedance between two or more ports 170, e.g., the port 170a and the port 170b, of the electric field generator 54. Monitoring the impedance may include determining, by the voltmeter 162, the applied voltage between the ports 170 and determining, by the ammeter 158, the applied current to a port 170, and calculating the impedance between the ports 170 based on the applied voltage and the applied current by dividing the applied voltage by the applied current, for example.

In one embodiment, controlling a current of the electric signal (step 244) includes controlling a current of the electric signal to maintain the current within plus or minus 5% of a current threshold 248 during a period of time in which the measured impedance is below an impedance threshold. In some embodiments, the impedance threshold is based on the pads 70 connected to the electric field generator 54. The impedance between the ports 170 may change over time based on conditions at the skin-pad interface, i.e., conditions between each pad 70 and the patient's skin, as discussed above. For example, over time, movement and natural bodily processes may cause a skin-pad interface impedance to increase. The impedance threshold may be determined based on a maximum allowable impedance between the ports 170 wherein a predicted temperature is below the temperature threshold described above.

In one embodiment, controlling a current of the electric signal (step 244) includes controlling a current of the electric signal to maintain the current within a range of 95% to 100% of the current threshold 248 during the period of time in which the measured impedance is below the impedance threshold.

In one embodiment, the impedance threshold is in the range of about 110Ω and about 140Ω, or in some cases between about 120Ω and 130Ω. In another embodiment, the impedance threshold is determined based on a pad location on the user's body, that is, the impedance threshold may be different if the pads 70 are placed in the torsal region than if the pads 70 are placed in the cranial region, for example.

In one embodiment, controlling a current of the electric signal (step 244) includes adjusting, by the amplifier 154 the current applied to the electric signal received from the frequency generator 150. In some embodiments, controlling the current of the electric signal (step 244) includes adjusting the current of the electric signal generated by the frequency generator 150. In some embodiments, controlling the current of the electric signal (step 244) includes adjusting current supplied by the power supply 166.

In one embodiment, controlling a current of the electric signal (step 244) is performed independent of a temperature reading from any temperature sensor. For example, controlling a current of the electric signal (step 244) may be performed without a signal or other communication with a temperature sensor.

As discussed above, during the maintenance phase 228, the control process 220 includes: maintaining a voltage of the electric signal and reducing the current of the electric signal (step 246).

In one embodiment, maintaining a voltage of the electric signal and reducing the current of the electric signal (step 246) includes reducing, by the amplifier 154 the current applied to the electric signal received from the frequency generator 150 while maintaining the voltage applied to the electric signal at about the voltage threshold. In some embodiments, maintaining a voltage of the electric signal and reducing the current of the electric signal (step 246) includes reducing the current of the electric signal generated by the frequency generator 150 while maintaining the voltage applied to the electric signal at about the voltage threshold. In some embodiments, maintaining a voltage of the electric signal and reducing the current of the electric signal (step 246) includes reducing current supplied by the power supply 166 while maintaining a voltage applied to the electric signal at about the voltage threshold.

In one embodiment, maintaining a voltage of the electric signal and reducing the current of the electric signal (step 246) includes reducing, as described above, the current applied to the electric signal received from the frequency generator 150 while maintaining the voltage applied to the electric signal at about the voltage threshold such that the current applied to the electric signal and the voltage applied to the electric signal cause the electric signal to have a power within plus or minus 5% of the power threshold, within a range of about 440 W to about 480 W, that is, the power threshold may have an upper power threshold of about 480 W and a lower power threshold of about 320 W, and/or within a range of about 95% to 100% of the upper power threshold.

In one embodiment, maintaining the voltage applied to the electric signal at about the voltage threshold includes maintaining the voltage within plus or minus 5% of the voltage threshold 252, maintaining the voltage to within a range of about 20 V to about 240 V, that is, the voltage threshold may have an upper voltage threshold of about 240 V and a lower voltage threshold of about 20 V, and/or maintaining the voltage to within a range of about 95% to 100% of the upper voltage threshold 252.

In one embodiment, maintaining a voltage of the electric signal and reducing the current of the electric signal (step 246) is performed independent of a temperature reading from any temperature sensor. For example, maintaining a voltage of the electric signal and reducing the current of the electric signal (step 246) may be performed without a signal or other communication with a temperature sensor.

In one embodiment, the control process 220 is performed without, or independent from, a temperature signal, and/or any other signal or communication, from a temperature sensor and/or indicative of a temperature of any pad 70.

Figure 8A:
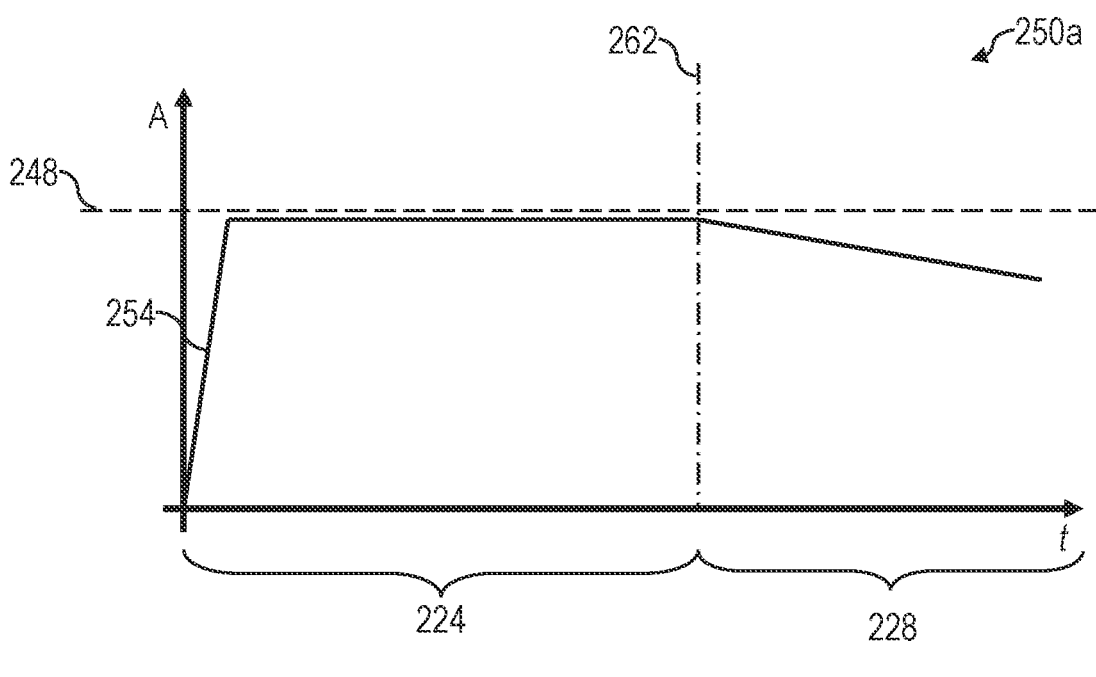
FIG. 8A is a timewise graph of an exemplary embodiment of a current of an electric signal caused by the control process of FIG. 7
Figure 8B:
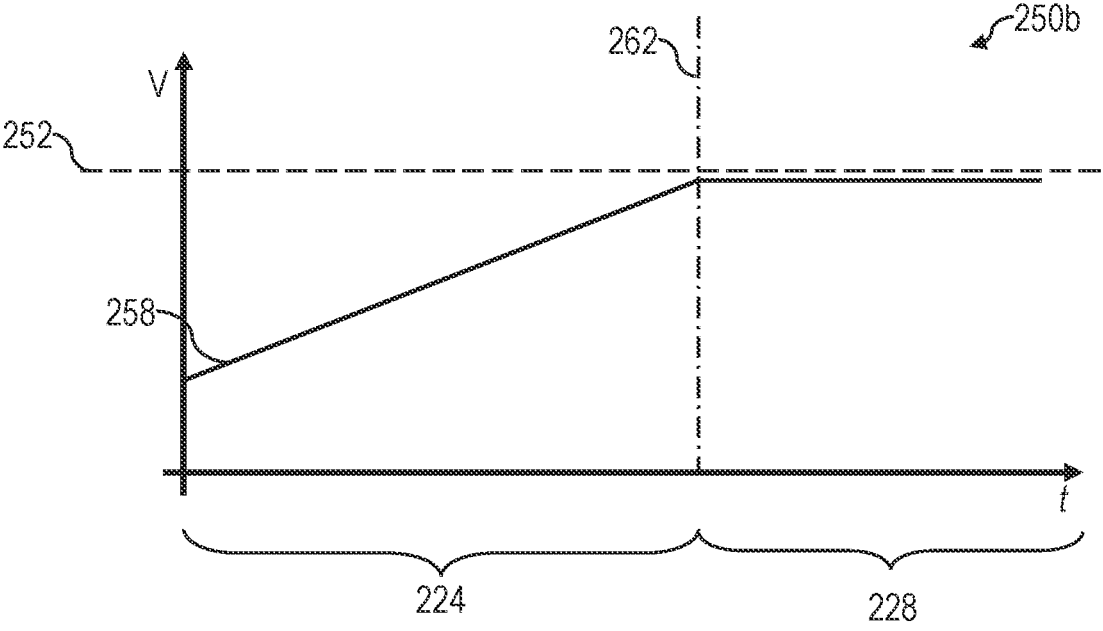
FIG. 8B is a timewise graph of an exemplary embodiment of a voltage of an electric signal caused by the control process of FIG. 7.

Referring now to FIG. 8A and FIG. 8B in combination, shown in FIG. 8A is a timewise graph 250a of an exemplary embodiment of a current 254 of the electric signal caused by the control process of FIG. 7 and shown in FIG. 8B is a timewise graph 250b of an exemplary embodiment of a voltage 258 of the electric signal caused by the control process of FIG. 7.

As shown in the timewise graph 250a, the current 254 increases until the current 254 reaches the current threshold 248 as described above. The current 254 is maintained at about the current threshold 248 for the duration of the initiation phase 224. In one embodiment, as described above, the current of the electric signal applied to the pads 70 is maintained to within plus or minus 5% of the current threshold 248 during the initiation phase 224 or as described with respect to step 236 above.

As described above in more detail, overtime, the impedance between the ports 170 may increase. Shown in the timewise graph 250b, the voltage 258 increases over time, t, due to the increase in impedance until the voltage 258 reaches the voltage threshold 252 at inflection point 262 as described above. When the voltage 258 reaches the voltage threshold 252 at inflection point 262, the electric field generator 54 prevents the voltage 258 from increasing beyond the voltage threshold 252.

At the inflection point 262, the control process 220 enters the maintenance phase 228 and the electric field generator 54 may adjust the current 254, e.g., the current of the electric signal supplied to the pads 70, to an amperage lower than the current threshold 248 while maintaining the voltage 258 at or about the voltage threshold 252.

The foregoing description provides illustration and description, but is not intended to be exhaustive or to limit the inventive concepts to the precise form disclosed. Modifications and variations are possible in light of the above teachings or may be acquired from practice of the methodologies set forth in the present disclosure.

Even though particular combinations of features and steps are recited in the claims and/or disclosed in the specification, these combinations are not intended to limit the disclosure. In fact, many of these features and steps may be combined in ways not specifically recited in the claims and/or disclosed in the specification. Although each dependent claim listed below may directly depend on only one other claim, the disclosure includes each dependent claim in combination with every other claim in the claim set.

Similarly, although each illustrative embodiment listed above may directly depend on only one other illustrative embodiment, the disclosure includes each illustrative embodiment in combination with every other illustrative embodiment in the set of illustrative embodiments for each mode of the inventive concepts disclosed herein.

No element, act, or instruction used in the present application should be construed as critical or essential to the invention unless explicitly described as such outside of the preferred embodiment. Further, the phrase "based on" is intended to mean "based, at least in part, on" unless explicitly stated.

What is claimed is:

1. A system for generating TTFields, comprising:
a first port operable to receive a lead of a first pad;
a second port operable to receive a lead of a second pad;
an electric field generator having circuitry operable to generate an electric signal having a frequency, a current, and a voltage, the frequency in a range of 50 kHz to 500 kHz, the circuitry operable to supply the electric signal to the first port and the second port, to determine a measured voltage and a measured impedance of the electric signal between the first port and the second port, and to control the current to maintain the current within plus or minus 5% of a current threshold during a period of time in which at least one of the measured voltage and the measured impedance is below a threshold; and
a power supply operable to supply power to the electric field generator.

2. The system of claim 1, wherein the threshold is a voltage threshold, and wherein the circuitry includes a voltmeter operably connected to the first port and the second port, and further comprises monitoring a voltage between the first port and the second port with the voltmeter and upon the voltage reaching a voltage threshold, maintaining the voltage within a range of plus or minus 5% of the voltage threshold.

3. The system of claim 1, wherein the threshold is a voltage threshold, and wherein the circuitry includes a voltmeter operably connected to the first port and the second port, and further comprises monitoring a voltage between the first port and the second port with the voltmeter and upon the voltage reaching a voltage threshold, maintaining the voltage within a range of 95% to 100% of the voltage threshold.

4. The system of claim 3, wherein the current threshold is within a range of 1.5 A to 3 A for a cranial system and between 1.5 A to 5 A for a torsal system, and the voltage threshold is within a range of 20 V to 240 V.

5. The system of claim 1, wherein threshold is a voltage threshold, and wherein the circuitry of the electric field generator decreases the current when the voltage is within a range of 95% to 100% of the voltage threshold.

6. The system of claim 1, wherein the threshold is a voltage threshold, and wherein the circuitry of the electric field generator sets the current at the current threshold when the voltage is below the voltage threshold.

7. The system of claim 1, wherein the current threshold is determined based on a desired electric signal duration.

8. The system of claim 1, wherein the current of the electric signal of the electric field generator is operable to control the current independent (without) of a temperature reading from a temperature sensor.

9. A method for generating TTFields, the method comprising:

determining a current threshold for a pad;

supplying, by circuitry of an electric field generator, an electric signal having a frequency in a range of 50 kHz to 1 MHz to a first port and a second port of the electric field generator;

monitoring, by the circuitry of the electric field generator, an impedance between the first port and the second port; and controlling, by the circuitry of the electric field generator, a current of the electric signal to maintain the current within plus or minus 5% of a current threshold during a period of time in which the monitored impedance is below an impedance threshold.

10. The method of claim 9, further comprising:

determining a voltage threshold for the pad; and monitoring, by a voltmeter of the circuitry, a voltage between the first port and the second port.

11. The method of claim 10, further comprising, upon the voltage reaching the voltage threshold, controlling, by the circuitry of the electric field generator, a voltage of the electric signal to maintain the voltage within a range of plus or minus 5% of the voltage threshold.

12. The method of claim 10, further comprising, upon the voltage reaching the voltage threshold, controlling, by the circuitry of the electric field generator, a voltage of the electric signal to maintain the voltage within a range of 95% to 100% of the voltage threshold.

13. The method of claim 10, wherein determining the voltage threshold for the pad includes determining the voltage threshold is within a range of 20 V to 240 V.

14. The method of claim 10, wherein controlling, by the circuitry of the electric field generator, the current of the electric signal further includes decreasing the current of the electric signal when the voltage is within a range of 95% to 100% of the voltage threshold.

15. The method of claim 10, wherein controlling, by the circuitry of the electric field generator, the current of the electric signal further includes controlling, by the circuitry of the electric field generator, the current at about the current threshold when the voltage between the first port and the second port is below the voltage threshold.

16. The method of claim 9, wherein determining the current threshold for the pad includes determining the current threshold is within a range of 1.5 to 5 Amperes.

17. The method of claim 9, wherein supplying, by circuitry of the electric field generator, the electric signal includes supplying, by circuitry of the electric field generator, the electric signal further comprising one or more of a sine waveform, modified sine waveform, square waveform, or triangle waveform.

18. The method of claim 9, wherein determining the current threshold for the pad further includes determining the current threshold for the pad based in part on a desired electric signal duration.

19. The method of claim 9, wherein controlling, by the circuitry of the electric field generator, the current of the electric signal is performed independent of a temperature reading from a temperature sensor.

20. A system for generating TTFields, comprising:

a first port operable to receive a lead of a first pad;

a second port operable to receive a lead of a second pad;

an ammeter operable to determine a measured current of an electric signal supplied to the first port;

at least one meter selected from the group consisting of a voltmeter and an ohmmeter;

the voltmeter operable to determine a measured voltage between the first port and the second port; and the ohmmeter operable to determine a measured impedance between the first port and the second port;

an electric field generator comprising circuitry operable to generate the electric signal having a frequency, a current, and a voltage, the frequency in a range of 50 kHz to 500 kHz, the circuitry operable to supply the electric signal to the first port and the second port, and to control the current to maintain the measured current within plus or minus 5% of a current threshold during a period of time in which at least one of the measured voltage and the measured impedance is below a threshold; and a power supply operable to supply power to the electric field generator.

* * * * *